(12) United States Patent
Shigenobu

(10) Patent No.: US 6,566,942 B2
(45) Date of Patent: May 20, 2003

(54) MULTISTAGE AMPLIFIER CIRCUIT

(75) Inventor: Takeshi Shigenobu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/931,060

(22) Filed: Aug. 17, 2001

(65) Prior Publication Data

US 2002/0145468 A1 Oct. 10, 2002

(30) Foreign Application Priority Data

Apr. 10, 2001 (JP) ........................................ 2001-111920

(51) Int. Cl.[7] ................................................. H03F 1/02
(52) U.S. Cl. ........................................... 330/9; 330/150
(58) Field of Search ................................ 330/9, 51, 69, 330/150; 327/124

(56) References Cited

U.S. PATENT DOCUMENTS 6,262,626 B1 * 7/2001 Bakker et al. ................. 330/9
6,333,673 B2 * 12/2001 Dawes ........................... 330/9

FOREIGN PATENT DOCUMENTS

| JP | 9-069761 | 3/1997 |
| JP | 9-307413 | 11/1997 |
| JP | 11-8535 | 1/1999 |

* cited by examiner

*Primary Examiner*—Steven J. Mottola
(74) *Attorney, Agent, or Firm*—Leydig, Voit & Mayer, Ltd.

(57) ABSTRACT

A coupler/isolator alternatively couples and isolates unit amplifiers of a multiple stage chopper amplifier to shift gradually and slightly reset timing and amplification timing of the chopper amplifiers. In this way, a first-stage chopper amplifier to an n-th timing of the chopper amplifiers. In this way, a first-stage chopper amplifier to an n-th stage chopper amplifier are sequentially reset. The first-stage chopper amplifier to the n-th stage chopper amplifier are sequentially operated to amplify, in a pipeline format, a differential voltage between a signal voltage input to a signal voltage input terminal and a reference voltage input to a reference voltage input terminal, and supply the amplified differential voltage to a next-stage circuit.

6 Claims, 6 Drawing Sheets

FIG.2A  OPERATION OF THE SWITCHES 9 AND 10 THAT CONSTITUTE THE SECOND-STAGE CHOPPER AMPLIFIER 11(2)

FIG.2B  OPERATION OF THE SWITCHES 12 AND 14 THAT CONSTITUTE THE FIRST-STAGE COUPLER/ISOLATOR 15(1)

FIG.2C  OPERATION OF THE SWITCH 13 THAT CONSTITUTES THE FIRST-STAGE COUPLER/ISOLATOR 15(1)

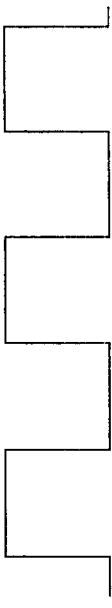

FIG.2D  OPERATION OF THE SWITCHES 9 AND 10 THAT CONSTITUTE THE FIRST-STAGE CHOPPER AMPLIFIER 11(1)

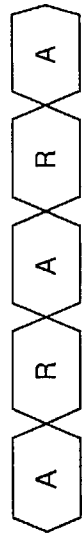

FIG.2E  OPERATION OF THE FIRST-STAGE CHOPPER AMPLIFIER 11(1)

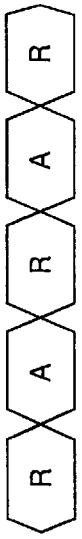

FIG.2F  OPERATION OF THE SECOND-STAGE CHOPPER AMPLIFIER 11(2)

A: AMPLIFYING PERIOD
R: RESET PERIOD

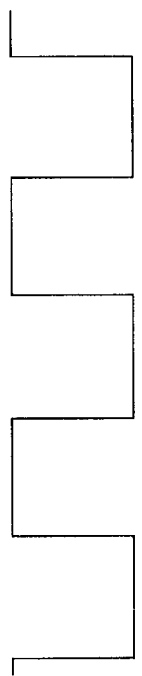
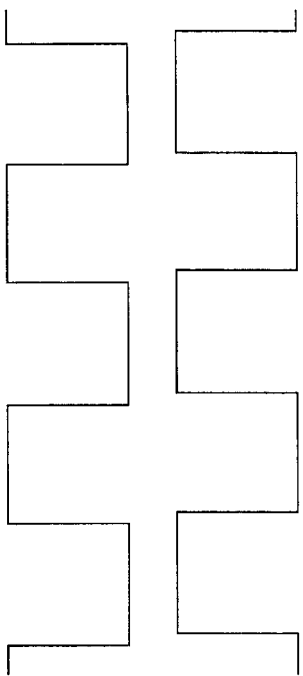
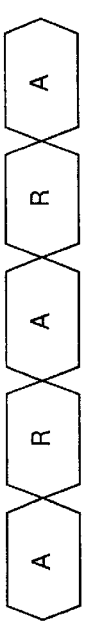

FIG.4A  OPERATION OF THE SWITCHES 9 AND 10 THAT CONSTITUTE EACH OF THE CHOPPER AMPLIFIERS $11_{(i)}$ TO $11_{(n)}$ OF THE POST-STAGE AMPLIFYING SECTION 23

FIG.4B  OPERATION OF THE SWITCHES 12 AND 14 THAT CONSTITUTE THE COUPLER/ISOLATOR 15

FIG.4C  OPERATION OF THE SWITCH 13 THAT CONSTITUTES THE COUPLER/ISOLATOR 15

FIG.4D  OPERATION OF THE SWITCHES 9 AND 10 THAT CONSTITUTE EACH OF THE CHOPPER AMPLIFIERS $11_{(1)}$ TO $11_{(i-1)}$ OF THE PRE-STAGE AMPLIFYING SECTION 22

FIG.4E  OPERATION OF THE CHOPPER AMPLIFIERS $11_{(1)}$ TO $11_{(i-1)}$ THAT CONSTITUTE THE PRE-STAGE AMPLIFYING SECTION 22

FIG.4F  OPERATION OF THE CHOPPER AMPLIFIERS $11_{(1)}$ TO $11_{(n)}$ THAT CONSTITUTE THE POST-STAGE AMPLIFYING SECTION 23

A : AMPLIFYING PERIOD
R : RESET PERIOD

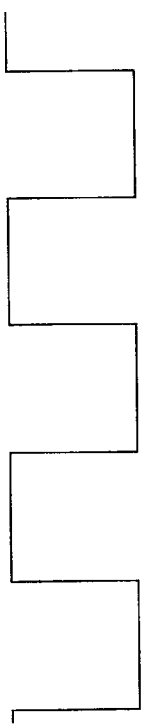
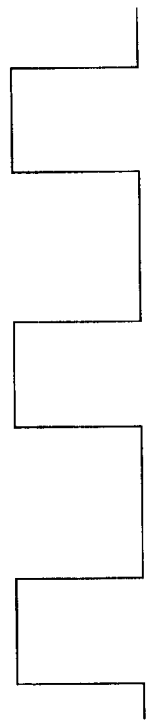
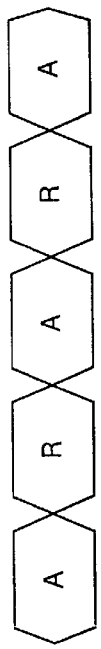
FIG.6A  OPERATION OF THE SWITCHES 107 AND 108 OF EACH OF THE CHOPPER AMPLIFIERS 106a TO 106n
FIG.6B  OPERATION OF THE SWITCH 103
FIG.6C  OPERATION OF THE SWITCH 105
FIG.6D  OPERATION OF THE CHOPPER AMPLIFIERS 106a TO 106n
A: AMPLIFYING PERIOD
R: RESET PERIOD

… (1)

MULTISTAGE AMPLIFIER CIRCUIT

FIELD OF THE INVENTION

The present invention relates to a multistage amplifier circuit used inside an analog/digital converter or the like. The invention particularly relates to a multistage amplifier circuit having a plurality of chopper amplifiers connected in multiple stages, for amplifying an input potential difference while resetting each chopper amplifier in a predetermined period.

BACKGROUND OF THE INVENTION

At present, an operational amplifier is manufactured using CMOS processing. The CMOS devices have a gate oxide film which has become thinner in the development of finer line widths in CMOS processing. Based on this, dielectric strength has been lowered, and power source voltage has also been lowered. This kind of operational amplifier can take a large linear input range when the power source voltage has been increased or when the number of vertically piled-up transistors is made smaller. Therefore, the operational amplifier of the type that is operated at a low power source voltage secures a necessary linear input range by minimizing the number of vertically piled-up transistors.

However, in this case, the gain obtained by the operational amplifier is lowered. Therefore, in order to overcome this difficulty, in many cases, the necessary gain is secured by connecting operational amplifiers in multiple stages.

FIG. 5 is a circuit diagram showing one example of a multistage amplifier circuit having these operational amplifiers connected at multi-stages. This multistage amplifier circuit 101 has the signal voltage input terminal 102 for taking in a signal voltage to be amplified, switch 103 for passing a signal voltage applied to the signal voltage input terminal 102 and transferring this signal voltage to a next-stage circuit when the switch is in the ON status, reference voltage input terminal 104 for taking in a reference voltage, switch 105 for passing the reference voltage applied to the reference voltage input terminal 104 and transferring this reference voltage to a next-stage circuit when the switch is in the ON status, and the plural chopper amplifiers 106a to 106n that are connected at multi-stages, for amplifying a differential voltage between the signal voltage and the reference voltage supplied via the switches 103 and 105 respectively.

For amplifying the differential voltage between the signal voltage and the reference voltage that have been input to the signal voltage input terminal 102 and the reference voltage input terminal 104 respectively, first, switches 107 and 108 that constitute the chopper amplifiers 106a to 106n respectively are set to the ON status as shown in FIG. 6A and FIG. 6B. With this arrangement, an input terminal and an output terminal of each operational amplifier 111 that constitutes each of the chopper amplifiers 106a to 106n are short-circuited, thereby to self-bias to an optimum DC operation point. Thus, the chopper amplifiers 106a to 106n are reset (a reset period).

Next, the switches 107 and 108 of the chopper amplifiers 106a to 106n respectively are set to the OFF status thereby to cancel the reset as shown in FIG. 6A and FIG. 6B. At a point of time when the period has been shifted to an amplifying period, a signal voltage applied to the signal voltage input terminal 102 is transferred to the first-stage chopper amplifier 106a via the switch 103 that is in the ON status as shown in FIG. 6A, FIG. 6B and FIG. 6D. Thus, a charge corresponding to the signal voltage is held in capacitors 109 and 110 that constitute each of the first-stage chopper amplifier 106a to the n-th stage chopper amplifier 106n (a sampling period that constitutes the amplifying period).

Thereafter, the switch 103 is set to the OFF status and the switch 105 is set to the ON status as shown in FIG. 6A, FIG. 6C, and FIG. 6D. Thus, a reference voltage input to the reference voltage input terminal 104 is transferred to the first-stage chopper amplifier 106a, thereby to adjust the charge of the capacitors 109 and 110 that constitute each of the first-stage chopper amplifier 106a to the n-th stage chopper amplifier 106n.

With the above arrangement, each operational amplifier 111 that constitutes each of the first-stage chopper amplifier 106a to the n-th stage chopper amplifier 106n amplifies a differential voltage between the signal voltage and the reference voltage held in the capacitors 109 and 110 respectively, as expressed by an equation shown below. As a result, an output voltage not depending on the potential of the signal voltage is obtained based on an optimum DC operation point set during the reset period (the amplifying period).

$$\Delta V_{out} = A_1 \cdot A_2 \cdots A_n \cdot (V_{in} - V_{ref}) \quad \ldots (1)$$

where $\Delta V_{out}$: output voltage, $A_1$: amplification factor of the chopper amplifier 106a, $A_2$: amplification factor of the chopper amplifier 106b, $A_n$: amplification factor of the chopper amplifier 106n, $V_{in}$: signal voltage, $V_{ref}$: reference voltage.

According to the above conventional multistage amplifier circuit 101, all the chopper amplifiers 106a to 106n are reset at the same time, and then these chopper amplifiers carry out an amplification operation at the same time. This operation is repeated to amplify the differential voltage between the signal voltage applied to the signal voltage input terminal 102 and the reference voltage applied to the reference voltage input terminal 104. Therefore, when the number "n" of the stages from the chopper amplifier 106a to the chopper amplifier 106n is increased, the operation range becomes smaller. This has had a problem in that it is not possible to achieve a high-speed operation.

SUMMARY OF THE INVENTION

It is an object of the present invention to provide a multistage amplifier circuit capable of carrying out a high-speed operation based on a wide operation range even when an amplification factor has been increased by increasing the number of connection stages of unit amplifiers.

It is another object of the present invention to provide a multistage amplifier circuit capable of carrying out a high-speed operation based on a wide operation range even when an amplification factor has been increased by increasing the number of connection stages of unit amplifiers, while decreasing the number of parts used and simplifying a control procedure.

According to one aspect of this invention, in the multistage amplifier circuit having a first-stage chopper amplifier to an n-th stage chopper amplifier connected at multi-stages, for sequentially amplifying an input signal, m (where m<n) coupler/isolators are disposed between the first-stage chopper amplifier and the n-th stage chopper amplifier, and the coupler/isolators couple and isolate the first-stage chopper amplifier to the n-th stage chopper amplifier to sequentially shift a reset timing and an amplification timing of the first-stage chopper amplifier to the n-th stage chopper amplifier, thereby to make the first-stage chopper amplifier to the n-th stage chopper amplifier amplify the input signal in a pipeline format. With the above structure, it is possible to carry out a high-speed operation based on a wide operation range even when the amplification factor has been increased by increasing the number of connection of unit amplifiers at stages from the first-stage chopper amplifier to the n-th stage chopper amplifier.

Other objects and features of this invention will become apparent from the following description with reference to the accompanying drawings.

BRIEF DESCRIPTION OF THE DRAWINGS

FIG. 2A to FIG. 2F are timing charts showing an operation example of the multistage amplifier circuit shown in FIG. 1;

FIG. 4A to FIG. 4F are timing charts showing an operation example of the multistage amplifier circuit shown in FIG. 3;

FIG. 6A to FIG. 6D are timing charts showing an operation example of the multistage amplifier circuit shown in FIG. 5.

DESCRIPTION OF THE PREFERRED EMBODIMENTS

Embodiments of a multistage amplifier circuit relating to the present invention will be explained in detail below with reference to the drawings.

Figure 1:
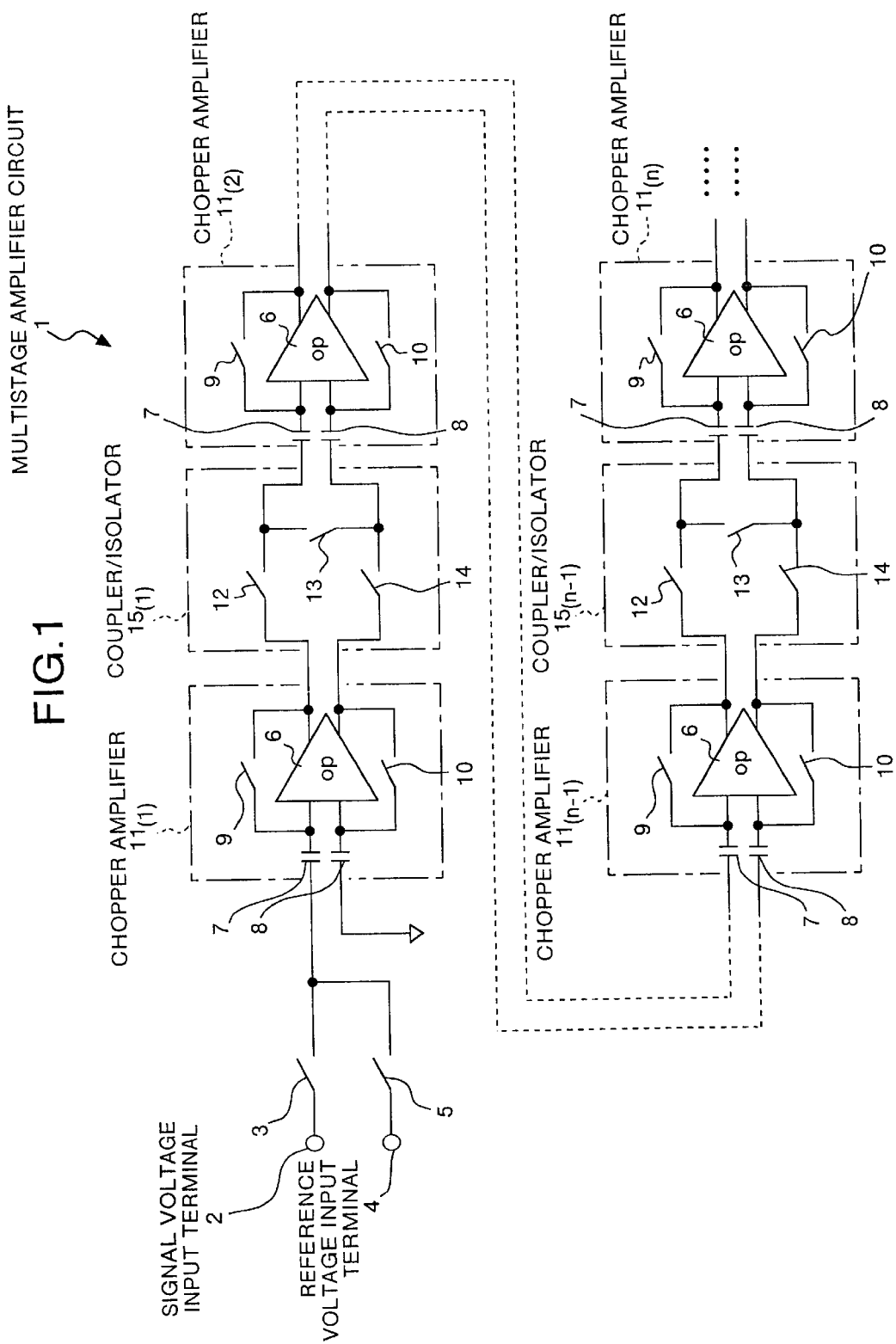
FIG. 1 is a block diagram showing one embodiment of a multistage amplifier circuit according to the present invention.

FIG. 1 is a block diagram showing one embodiment of a multistage amplifier circuit according to the present invention. This multistage amplifier circuit 1 consists of the signal voltage input terminal 2 for taking in a signal voltage to be amplified, switch 3 for passing a signal voltage applied to the signal voltage input terminal 2 and transferring this signal voltage to a next-stage circuit when the switch is in the ON status, reference voltage input terminal 4 for taking in a reference voltage, switch 5 for passing the reference voltage applied to the reference voltage input terminal 4 and transferring this reference voltage to a next-stage circuit when the switch is in the ON status, n chopper amplifiers $11_{(1)}$ to $11_{(n)}$ each structured by one operational amplifier 6, two capacitors 7 and 8, and two switches 9 and 10, for sequentially amplifying in a pipeline format a differential voltage between the signal voltage and the reference voltage supplied via the switches 3 and 5 respectively, and (n−1) coupler/isolators $15_{(1)}$ to $15_{(n-1)}$ each structured by three switches 12, 13 and 14, for coupling and isolating the chopper amplifiers chopper amplifiers $11_{(1)}$ to $11_{(n)}$.

The first-stage coupler/isolator $15_{(1)}$ to the (n−1)-th stage coupler/isolator $15_{(n-1)}$ repeat isolation, coupling, isolation and so on between unit amplifiers from the first-stage chopper amplifier $11_{(1)}$ to the n-th stage chopper amplifier $11_{(n)}$ to shift gradually and slightly are set timing and an amplification timing of these chopper amplifiers, thereby to sequentially reset the first-stage chopper amplifier $11_{(1)}$ to the n-th stage chopper amplifier $11_{(n)}$. In this way, the chopper amplifiers are self-biased to an optimum DC operation point. At the same time, the first-stage chopper amplifier $11_{(1)}$ to the n-th stage chopper amplifier 11((n) are sequentially operated to amplify the differential voltage between the signal voltage input to the signal voltage input terminal 2 and the reference voltage input to the reference voltage input terminal 4, and supply the amplified differential voltage to a next-stage circuit (not shown).

The operation of the multistage amplifier circuit 1 will be explained below with reference to the circuit diagram shown in FIG. 1 and timing charts shown in FIG. 2A to FIG. 2F. In this multistage amplifier circuit 1, the chopper amplifiers $11_{(1)}$ to $11_{(n)}$ operate similarly around the coupler/isolators $15_{(1)}$ to $15_{(n-1)}$. Therefore, only the operation of the first-stage chopper amplifier $11_{(1)}$ and the second-stage chopper amplifier $11_{(2)}$ will be explained below.

First, when the amplification operation of a differential voltage between the signal voltage input to the signal voltage input terminal 2 and the reference voltage input to the reference voltage input terminal 4 has been started, the switches 9 and 10 that constitute the first-stage chopper amplifier $11_{(1)}$ are set to the OFF status, and the first-stage chopper amplifier $11_{(1)}$ is set to the amplification mode, as shown in FIG. 2D and FIG. 2E. At the same time, the switches 12 and 14 that constitute the first-stage coupler/isolator $15_{(1)}$ are set to the ON status while the switch 13 that constitutes the first-stage coupler/isolator $15_{(1)}$ is kept in the OFF status (a coupling mode), as shown in FIG. 2B and FIG. 2C. The differential voltage between the signal voltage and the reference voltage output from the operational amplifier 6 that constitutes the first-stage chopper amplifier $11_{(1)}$ is guided to each of the capacitors 7 and 8 that constitute the second-stage chopper amplifier $11_{(2)}$. At the same time, the switches 9 and 10 that constitute the second-stage chopper amplifier $11_{(2)}$ are set to the ON status, as shown in FIG. 2A and FIG. 2F. As a result, the input terminal and the output terminal of the operational amplifier 6 that constitutes the second-stage chopper amplifier $11_{(2)}$ are short-circuited, and the second-stage chopper amplifier $11_{(2)}$ is reset to an optimum DC operation point.

Next, the switches 9 and 10 that constitute the second-stage chopper amplifier $11_{(2)}$ are set to the OFF status. Each of the capacitors 7 and 8 that constitute the second-stage chopper amplifier $11_{(2)}$ samples the differential voltage between the signal voltage and the reference voltage output from the operational amplifier 6 that constitutes the first-stage chopper amplifier $11_{(1)}$. Then, the switches 12 and 14 that constitute the first-stage coupler/isolator $15_{(1)}$ are set to the OFF status, and the switch 13 that constitutes the first-stage coupler/isolator $15_{(1)}$ is set to the ON status (an isolation mode). As a result, the first-stage chopper amplifier $11_{(1)}$ and the second-stage chopper amplifier $11_{(2)}$ are electrically isolated.

Based on the above, the second-stage chopper amplifier $11_{(2)}$ is set to the amplification mode. The operational amplifier 6 that constitutes the second-stage chopper amplifier $11_{(2)}$ amplifies the differential voltage between the signal voltage and the reference voltage held by the capacitors 7 and 8 that constitute the second-stage chopper amplifier $11_{(2)}$, and guides the amplified differential voltage to the second-stage coupler/isolator (not shown) Next, the switches 9 and 10 that constitute the second-stage chopper amplifier $11_{(2)}$ are set to the OFF status (an amplification mode). Further, the switches 12 and 14 that constitute the first-stage coupler/isolator $15_{(1)}$ are set to the OFF status while the switch 13 that constitutes the first-stage coupler/isolator $15_{(1)}$ is kept in the ON status (an isolation mode). In this state, the switches 9 and 10 that constitute the first-stage chopper amplifier $11_{(1)}$ are set to the ON status. As a result, the input terminal and the output terminal of the operational amplifier 6 that constitutes the first-stage chopper amplifier $11_{(1)}$ are short-circuited, and the first-stage chopper amplifier $11_{(1)}$ is reset to an optimum DC operation point (a reset mode).

Next, the switches 9 and 10 that constitute the first-stage chopper amplifier $11_{(1)}$ are set to the ON status (a reset mode). Further, the switches 12 and 14 that constitute the first-stage coupler/isolator $15_{(1)}$ are set to the OFF status while the switch 13 that constitutes the first-stage coupler/isolator $15_{(1)}$ is kept in the ON status (an isolation mode). In this state, the switches 9 and 10 that constitute the second-stage chopper amplifier $11_{(2)}$ are set to the ON status. As a result, the input terminal and the output terminal of the operational amplifier 6 that constitutes the second-stage chopper amplifier $11_{(2)}$ are short-circuited, and the second-stage chopper amplifier $11_{(2)}$ is reset to an optimum DC operation point (a reset mode)

Next, the switches 9 and 10 that constitute the first-stage chopper amplifier $11_{(1)}$ are set to the OFF status (a reset mode). Further, the switches 12 and 14 that constitute the first-stage coupler/isolator $15_{(1)}$ are set to the ON status while the switches 9 and 10 that constitute the second-stage chopper amplifier $11_{(2)}$ are set to the OFF status (a reset mode). In this state, the switches 12 and 14 that constitute the first-stage coupler/isolator $15_{(1)}$ are set to the ON status. At the same time, the switch 13 that constitutes the first-stage coupler/isolator $15_{(1)}$ is set to the OFF status. As a result, the first-stage coupler/isolator $15_{(1)}$ is set to a coupling mode.

Next, the switches 9 and 10 that constitute the second-stage chopper amplifier $11_{(2)}$ are set to the ON status (a reset mode). Further, the switch 13 that constitutes the first-stage coupler/isolator $15_{(1)}$ is set to the OFF status while the switches 12 and 14 that constitute the first-stage coupler/isolator $15_{(1)}$ are kept in the ON status (a coupling mode). The switches 9 and 10 that constitute the first-stage chopper amplifier $11_{(1)}$ are set to the OFF status. As a result, the first-stage chopper amplifier $11_{(1)}$ is set to an amplification mode.

Consequently, each of the capacitors 7 and 8 that constitute the first-stage chopper amplifier $11_{(1)}$ sequentially samples the signal voltage and the reference voltage supplied via the switches 3 and 5 respectively. At the same time, the operational amplifier 6 that constitutes the first-stage chopper amplifier $11_{(1)}$ amplifies the differential voltage between the signal voltage and the reference voltage held by the capacitors 7 and 8 that constitute the first-stage chopper amplifier $11_{(1)}$. The operational amplifier 6 guides the amplified differential voltage to the capacitors 7 and 8 that constitute the second-stage chopper amplifier $11_{(2)}$.

Thereafter, the first-stage chopper amplifier $11_{(1)}$, the first-stage coupler/isolator $15_{(1)}$, ..., the (n−1)-th coupler/isolator 15(n−1), and the n-th stage chopper amplifier $11_{(n)}$ sequentially repeat the above first to sixth operations. The first-stage chopper amplifier $11_{(1)}$, and the n-th stage chopper amplifier $11_{(n)}$ sequentially amplify the differential voltage between the signal voltage and the reference voltage held by the capacitors 7 and 8 that constitute each of the first-stage chopper amplifier $11_{(1)}$ to the n-th stage chopper amplifier $11_{(n)}$. As a result, the amplified differential voltage is produced as an output voltage not depending on the potential of the signal voltage, based on an optimum DC operation point set during the reset period, as shown by the following equation. The output voltage is supplied to a next-stage circuit.

$$\Delta V_{out} = A_1 \cdot A_2 \cdot \ldots A_n \cdot (V_{in} - V_{ref}) \qquad \ldots (2)$$

where $\Delta V_{out}$=output voltage, $A_1$: amplification factor of the chopper amplifier $11_{1(1)}$, $A_2$: amplification factor of the chopper amplifier $11_{(2)}$, $A_n$: amplification factor of the chopper amplifier $11_{(n)}$, $V_{in}$: signal voltage, $V_{ref}$: reference voltage.

As explained above, according to the first embodiment, the first-stage coupler/isolator $15_{(1)}$ to the (n−1)-th stage coupler/isolator $15_{(n-1)}$ repeat the isolation, coupling, isolation and so on between unit amplifiers from the first-stage chopper amplifier $11_{(1)}$ to the n-th stage chopper amplifier $11_{(1)}$ to shift gradually and slightly are set timing and an amplification timing of these chopper amplifiers, thereby to sequentially reset the first-stage chopper amplifier $11_{(1)}$ to the n-th stage chopper amplifier $11_{(n)}$. In this way, the chopper amplifiers are self-biased to an optimum DC operation point. At the same time, the first-stage chopper amplifier $11_{(1)}$ to the n-th stage chopper amplifier $11_{(n)}$ are sequentially operated to amplify in a pipeline format the differential voltage between the signal voltage input to the signal voltage input terminal 2 and the reference voltage input to the reference voltage input terminal 4, and supply the amplified differential voltage to a next-stage circuit. Therefore, it is possible to switch each unit amplifier of the first-stage chopper amplifier $11_{(1)}$ to the n-th stage chopper amplifier $11_{(n)}$ from the reset mode to the amplification mode and from the amplification mode to the set mode. Based on this arrangement, it is possible to carry out a high-speed operation based on a wide operation range even when an amplification factor has been increased by increasing the number of connection stages from the first-stage chopper amplifier $11_{(1)}$ to the n-th stage chopper amplifier $11_{(n)}$.

Figure 3:
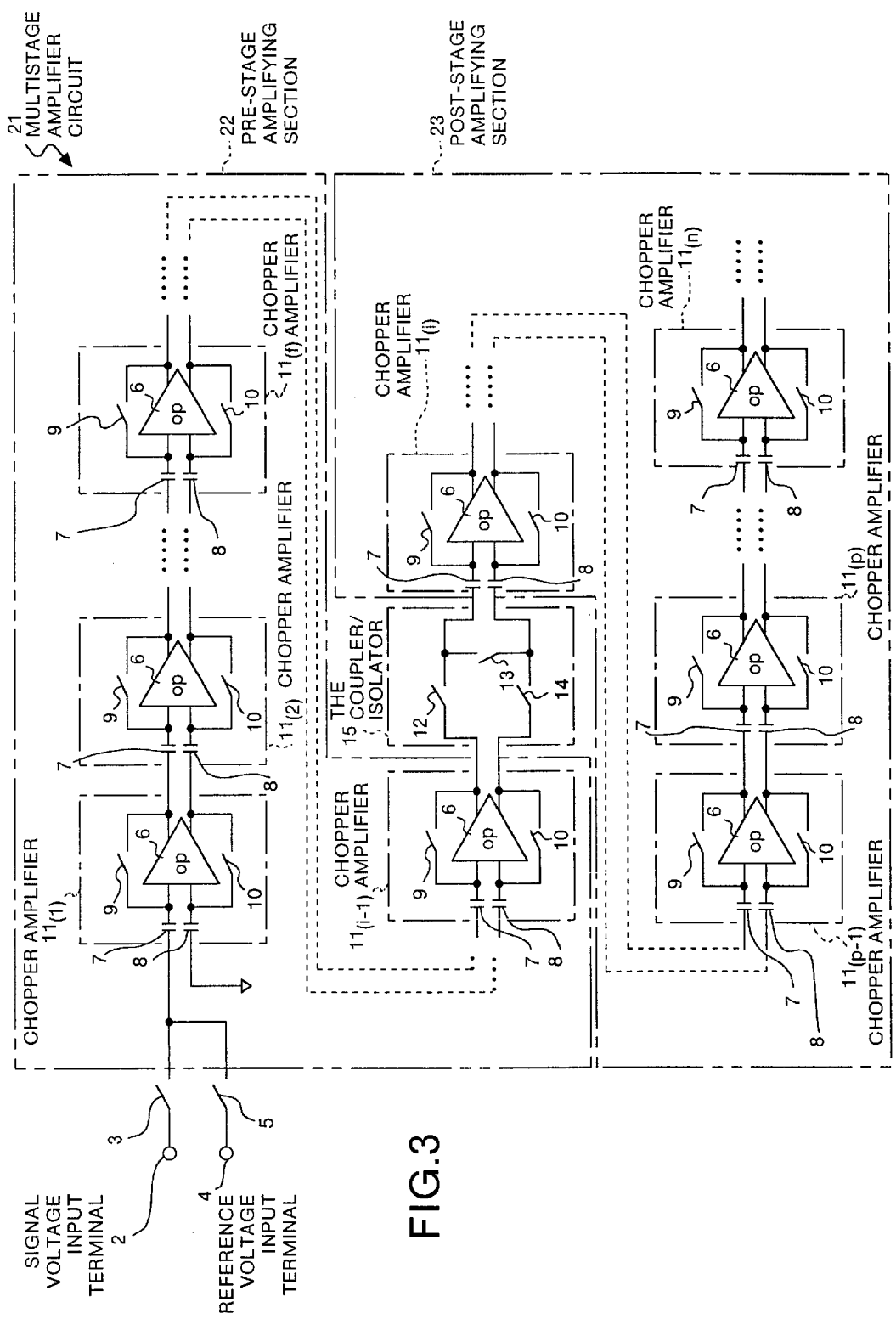
FIG. 3 is a block diagram showing another embodiment of a multistage amplifier circuit according to the present invention.
Figure 5:
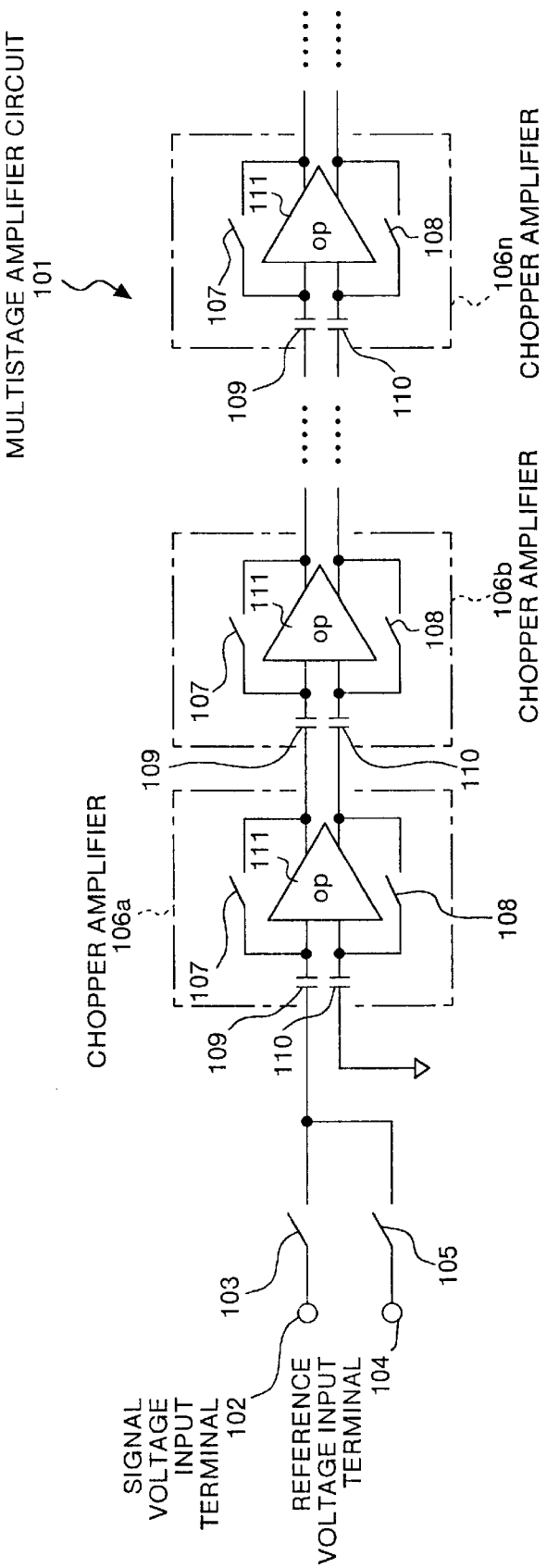
FIG. 5 is a block diagram showing one example of a known conventional multistage amplifier circuit.

FIG. 3 is a block diagram showing another embodiment of a multistage amplifier circuit according to the present invention. In FIG. 3, portions identical with those in FIG. 1 are attached with like reference numbers.

This multistage amplifier circuit 21 is different from the multistage amplifier circuit 1 shown in FIG. 1 in that a coupler/isolator 15 is disposed only between an (i−1)-th stage chopper amplifier $11_{(i-1)}$ and an i-th stage chopper amplifier $11_{(i)}$, and the coupler/isolator 15 repeats isolation, coupling, isolation and so on between a pre-stage amplifying section 22 consisting of a first-stage chopper amplifier $11_{(1)}$ to the (i−1)-th stage chopper amplifier $11_{(i-1)}$ and a post-stage amplifying section 23 consisting of the i-th stage chopper amplifier $11_{(i)}$ to an n-th stage chopper amplifier $11_{(n)}$, to shift gradually and slightly a reset timing and an amplification timing of the pre-stage amplifying section 22 and the post-stage amplifying section 23, thereby to sequentially reset the pre-stage amplifying section 22 and the post-stage amplifying section 23. In this way, the pre-stage amplifying section 22 and the post-stage amplifying section 23 are self-biased to an optimum DC operation point. At the same time, the pre-stage amplifying section 22 and the post-stage amplifying section 23 are sequentially operated to amplify a differential voltage between a signal voltage input to a signal voltage input terminal 2 and a reference voltage input to a reference voltage input terminal 4, and supply the amplified differential voltage to a next-stage circuit (not shown).

The operation of the multistage amplifier circuit 21 will be explained below with reference to the circuit diagram shown in FIG. 3 and timing charts shown in FIG. 4A to FIG. 4F.

First, when the amplification operation of a differential voltage between the signal voltage input to the signal voltage input terminal 2 and the reference voltage input to the reference voltage input terminal 4 has been started, switches 9 and 10 that constitute each of the chopper amplifiers $11_{(1)}$ to $11_{(i-1)}$ of the pre-stage amplifying section 22 are set to the OFF status, and the chopper amplifiers $11_{(1)}$ to $11_{(i-1)}$ of the pre-stage amplifying section 22 are set to the amplification mode, as shown in FIG. 4D and FIG. 4E. At the same time, switches 12 and 14 of the coupler/isolator 15 are set to the ON status while the switch 13 of the coupler/isolator 15 is kept in the OFF status (a coupling mode), as shown in FIG. 4B and FIG. 4C. A differential voltage between the signal voltage and the reference voltage output from the operational amplifier 6 that constitutes the chopper amplifier $11_{(i-1)}$ of the pre-stage amplifying section 22 is guided to each of capacitors 7 and 8 that constitute each of the chopper amplifiers $11_{(i)}$ to $11_{(n)}$ of the post-stage amplifying section 23. At the same time, switches 9 and 10 that constitute each of the chopper amplifiers $11_{(i)}$ to $11_{(n)}$ of the post-stage amplifying section 23 are set to the ON status, as shown in FIG. 4A and FIG. 4F. As a result, the input terminal and the output terminal of the operational amplifier 6 that constitutes each of the chopper amplifiers $11_{(1)}$ to $11_{(n)}$ of the post-stage amplifying section 23 are short-circuited, and each of the chopper amplifiers $11_{(1)}$ to $11_{(n)}$ of the post-stage amplifying section 23 is reset to an optimum DC operation point.

Next, the switches 9 and 10 that constitute each of the chopper amplifiers $11_{(i)}$ to $11_{(n)}$ of the post-stage amplifying section 23 are set to the OFF status. Each of the capacitors 7 and 8 that constitute each of the chopper amplifiers $11_{(i)}$ to $11_{(n)}$ of the post-stage amplifying section 23 samples the differential voltage between the signal voltage and the reference voltage output from the operational amplifier 6 that constitutes the chopper amplifier $11_{(i-1)}$ of the pre-stage amplifying section 22. Then, the switches 12 and 14 of the coupler/isolator 15 are set to the OFF status, and the switch 13 of the coupler/isolator 15 is set to the ON status (an isolation mode). As a result, the chopper amplifiers $11_{(1)}$ to $11_{(i-1)}$ of the pre-stage amplifying section 22 and the chopper amplifiers $11_{(i)}$ to $11_{(n)}$ of the post-stage amplifying section 23 are electrically isolated.

Based on the above, the chopper amplifiers $11_{(i)}$ to $11_{(n)}$ of the post-stage amplifying section 23 are set to the amplification mode. The operational amplifier 6 that constitutes each of the chopper amplifiers $11_{(i)}$ to $11_{(n)}$ of the post-stage amplifying section 23 amplifies the differential voltage between the signal voltage and the reference voltage held by the capacitors 7 and 8 that constitute each of the chopper amplifiers $11_{(i)}$ to $11_{(n)}$ of the post-stage amplifying section 23, and guides the amplified differential voltage to a next-stage circuit (not shown).

Next, the switches 9 and 10 that constitute each of the chopper amplifiers $11_{(i)}$ to $11_{(n)}$ of the post-stage amplifying section 23 are set to the OFF status (an amplification mode). Further, the switches 12 and 14 of the coupler/isolator 15 are set to the OFF status while the switch 13 of the coupler/isolator 15 is kept in the ON status (an isolation mode). In this state, the switches 9 and 10 that constitute each of the chopper amplifiers $11_{(1)}$ to $11_{(i-1)}$ of the pre-stage amplifying section 22 are set to the ON status. As a result, the input terminal and the output terminal of the operational amplifier 6 that constitutes each of the chopper amplifiers $11_{(1)}$ to $11_{(i-1)}$ of the pre-stage amplifying section 22 are short-circuited, and each of the chopper amplifiers $11_{(1)}$ to $11_{(i-1)}$ of the pre-stage amplifying section 22 is reset to an optimum DC operation point (a reset mode).

Next, the switches 9 and 10 that constitute each of the chopper amplifiers $11_{(1)}$ to $11_{(i-1)}$ of the pre-stage amplifying section 22 are set to the ON status (are set mode). Further, the switches 12 and 14 of the coupler/isolator 15 are set to the OFF status while the switch 13 of the coupler/isolator 15 is kept in the ON status (an isolation mode). In this state, the switches 9 and 10 that constitute each of the chopper amplifiers $11_{(i)}$ to $11_{(n)}$ of the post-stage amplifying section 23 are set to the ON status. As a result, the input terminal and the output terminal of the operational amplifier 6 that constitutes each of the chopper amplifiers $11_{(i)}$ to $11_{(n)}$ of the post-stage amplifying section 23 are short-circuited, and each of the chopper amplifiers $11_{(i)}$ to $11_{(n)}$ of the post-stage amplifying section 23 is reset to an optimum DC operation point (a reset mode).

Next, the switches 9 and 10 that constitute each of the chopper amplifiers $11_{(1)}$ to $11_{(i-1)}$ of the pre-stage amplifying section 22 are set to the OFF status (a reset mode). Further, the switches 12 and 14 of the coupler/isolator 15 are set to the ON status while the switches 9 and 10 that constitute each of the chopper amplifiers $11_{(i)}$ to $11_{(n)}$ of the post-stage amplifying section 23 are set to the OFF status (a reset mode). In this state, the switches 12 and 14 of the coupler/isolator 15 are set to the ON status. At the same time, the switch 13 of the coupler/isolator 15 is set to the OFF status. As a result, the coupler/isolator 15 is set to a coupling mode.

Next, the switches 9 and 10 that constitute each of the chopper amplifiers $11_{(i)}$ to $11_{(n)}$ of the post-stage amplifying section 23 are set to the ON status (a reset mode) Further, the switch 13 of the coupler/isolator 15 is set to the OFF status while the switches 12 and 14 of the coupler/isolator 15 are kept in the ON status (a coupling mode). In this state, the switches 9 and 10 that constitute each of the chopper amplifiers $11_{(1)}$ to $11_{(i-1)}$ of the pre-stage amplifying section 22 are set to the OFF status. As a result, each of the chopper amplifiers $11_{(1)}$ to $11_{(i-1)}$ of the pre-stage amplifying section 22 is set to an amplification mode.

Consequently, each of the capacitors 7 and 8 that constitute each of the chopper amplifiers $11_{(1)}$ to $11_{(i-1)}$ of the pre-stage amplifying section 22 sequentially samples the signal voltage and the reference voltage supplied via the switches 3 and 5 respectively. At the same time, the operational amplifier 6 that constitutes each of the chopper amplifiers $11_{(1)}$ to $11_{(i-1)}$ of the pre-stage amplifying section 22 amplifies the differential voltage between the signal voltage and the reference voltage held by the capacitors 7 and 8 that constitute each of the chopper amplifiers $11_{(1)}$ to $11_{(i-1)}$ of the pre-stage amplifying section 22. The operational amplifier 6 guides the amplified differential voltage to the capacitors 7 and 8 that constitute each of the chopper amplifiers $11_{(1)}$ to $11_{(n)}$ of the post-stage amplifying section 23.

Thereafter, the chopper amplifiers $11_{(1)}$ to $11_{(i-1)}$ that constitute the pre-stage amplifying section 22, the coupler/isolator 15, and the chopper amplifiers $11_{(i)}$ to $11_{(n)}$ that constitute the post-stage amplifying section 23 sequentially repeat the above first to sixth operations. Each operational amplifier 6 that constitutes each of the chopper amplifiers $11_{(1)}$ to $11_{(i-1)}$ of the pre-stage amplifying section 22 and the chopper amplifiers $11_{(i)}$ to $11_{(n)}$ of the post-stage amplifying section 23 sequentially amplifies the differential voltage between the signal voltage and the reference voltage held by the capacitors 7 and 8 that constitute each of the chopper amplifiers $11_{(1)}$ to $11_{(i-1)}$ of the pre-stage amplifying section 22 and the chopper amplifiers $11_{(i)}$ to $11_{(n)}$ of the post-stage amplifying section 23. As a result, the amplified differential voltage is produced as an output voltage not depending on the potential of the signal voltage, based on an optimum DC operation point set during the reset period, as shown by the following equation. The output voltage is supplied to a next-stage circuit.

$$\Delta V_{out} = A_1 \cdot A_2 \cdot \ldots A_n \cdot (V_{in} - V_{ref}) \qquad \ldots (3)$$

where $\Delta V_{out}$: output voltage,
$A_1$: amplification factor of the chopper amplifier $11_{1(1)}$,
$A_2$: amplification factor of the chopper amplifier $11_{(2)}$,
$A_n$: amplification factor of the chopper amplifier
$V_{in}$: signal voltage,
$V_{ref}$: reference voltage.

As explained above, according to the second embodiment, the coupler/isolator 15 repeats isolation, coupling, isolation and so on between the pre-stage amplifying section 22 and the post-stage amplifying section 23 to shift gradually and slightly a reset timing and an amplification timing of the pre-stage amplifying section 22 and a reset timing and an amplification timing of the post-stage amplifying section 23. The chopper amplifiers $11_{(1)}$ to $11_{(i-1)}$ that constitute the pre-stage amplifying section 22 are reset simultaneously or are operated to carry out the amplification simultaneously, and the chopper amplifiers $11_{(1)}$ to $11_{(n)}$ that constitute the post-stage amplifying section 23 are reset simultaneously or are operated to carry out the amplification simultaneously. Therefore, only the coupler/isolator 15 can isolate, couple, isolate, and so on between the pre-stage amplifying section 22 and the post-stage amplifying section 23. As a result, it is possible to achieve a high-speed operation based on a wide operation range even when an amplification factor has been increased by increasing the number of connection stages of unit amplifiers, while decreasing the number of parts used and simplifying a control procedure.

As explained above, according to the multistage amplifier circuit relating to the present invention, it is possible to achieve a high-speed operation based on a wide operation range even when an amplification factor has been increased by increasing the number of connection stages of unit amplifiers.

Further, according to the multistage amplifier circuit relating to the present invention, it is possible to achieve a high-speed operation based on a wide operation range even when an amplification factor has been increased by increasing the number of connection stages of unit amplifiers, while decreasing the number of parts used and simplifying a control procedure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A multistage amplifier circuit comprising:
   n chopper amplifiers arranged from a first stage to an n-th stage for sequentially amplifying an input signal, each chopper amplifier including:
   first and second signal paths,
   a first capacitor and a first switch in said first signal path,
   a second capacitor and a second switch in said second signal path, and
   an operational amplifier common to said first and second signal paths; and
   m (where m<n) coupler/isolators disposed between respective pairs of said chopper amplifiers, each coupler/isolator including:
   third and fourth signal paths,
   third and fourth switches in said third and fourth signal paths, respectively, and
   a fifth switch that connects and disconnects said third and fourth signal paths, wherein one of said coupler/isolators is disposed between an (i−1)-th stage chopper amplifier and an i-th stage chopper amplifier, that are disposed between said first-stage and n-th stage chopper amplifiers, and said coupler/isolator alternatively couples and isolates said first-stage to (i−1)-th stage chopper amplifiers and said i-th stage to said n-th stage chopper amplifiers to shift reset timing and amplification timing of said first-stage to (i−1)-th stage chopper amplifiers sequentially, and the reset timing and the amplification timing of said i-th stage to n-th stage chopper amplifiers sequentially, so that said first-stage to n-th stage chopper amplifiers amplify the input signal in a pipeline format.

2. The multistage amplifier circuit according to claim 1, further compiling input terminals respectively corresponding to each of said first and second signal paths, wherein a voltage signal is input into said input terminal corresponding to said first signal path, and a reference voltage signal is input into said input terminal corresponding to said second signal path.

3. The multistage amplifier circuit according to claim 2, wherein an output voltage $\Delta V_{out}$ of said multistage amplifier circuit is expressed as:

$$\Delta V_{out} = A_1 \cdot A_2 \ldots A_n \cdot (V_{in} - V_{ref})$$

where $A_1$ to $A_n$ are respective amplification factors of said first stage through n-th stage chopper amplifiers, $V_{in}$ is the input voltage signal, and $V_{ref}$ is the input reference voltage signal.

4. The multistage amplifier circuit according to claim 1, wherein the input signals in said first and second signal paths are passed without change to the next circuit when the first switches in said first and second signal paths are closed, and the input signals in said first and second signal paths are passed through said operational amplifier when the switches in said first and second signal paths are open.

5. The multistage amplifier circuit according to claim 1, wherein a voltage signal is input to said first signal path, and a reference voltage signal is input to said second signal path.

6. The multistage amplifier circuit according to claim 1, wherein m is equal to n−1 and one of said coupler/isolators is provided between each pair of said chopper amplifiers.

* * * * *